US010622407B1

(12) United States Patent
Huang et al.

(10) Patent No.: US 10,622,407 B1
(45) Date of Patent: Apr. 14, 2020

(54) MAGNETIC MEMORY CELL AND FABRICATION METHOD THEREOF

(71) Applicant: UNITED MICROELECTRONICS CORP., Hsin-Chu (TW)

(72) Inventors: Rai-Min Huang, Taipei (TW); Hung-Yueh Chen, Hsinchu (TW); Ya-Huei Tsai, Tainan (TW); Yu-Ping Wang, Taoyuan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/546,277

(22) Filed: Aug. 20, 2019

(30) Foreign Application Priority Data

Jul. 15, 2019 (CN) .......................... 2019 1 0634743

(51) Int. Cl.
*H01L 27/22* (2006.01)
*H01L 43/02* (2006.01)
*H01L 23/532* (2006.01)
*G11C 11/16* (2006.01)
*H01L 23/528* (2006.01)
*H01L 23/522* (2006.01)

(52) U.S. Cl.
CPC .......... *H01L 27/228* (2013.01); *G11C 11/161* (2013.01); *H01L 23/528* (2013.01); *H01L 23/5226* (2013.01); *H01L 23/53257* (2013.01); *H01L 23/53295* (2013.01); *H01L 43/02* (2013.01)

(58) Field of Classification Search
None
See application file for complete search history.

(56) References Cited

U.S. PATENT DOCUMENTS

| 8,665,629 | B2 | 3/2014 | Park | |
|---|---|---|---|---|
| 8,848,423 | B2 | 9/2014 | Chung | |
| 2005/0078510 | A1* | 4/2005 | Jeong | ....................... G11C 11/15 365/158 |
| 2013/0221306 | A1* | 8/2013 | Nam | .................... H01L 45/1253 257/1 |
| 2016/0126289 | A1* | 5/2016 | Lee | ....................... H01L 27/228 257/252 |
| 2016/0284763 | A1* | 9/2016 | Tahmasebi | .......... G11C 11/1659 |

* cited by examiner

*Primary Examiner* — J. E. Schoenholtz
(74) *Attorney, Agent, or Firm* — Winston Hsu

(57) ABSTRACT

A magnetic memory cell includes a substrate having a memory region, a transistor within the memory region, a first dielectric layer disposed on the substrate, a landing pad in the first dielectric layer, a second dielectric layer covering the first dielectric layer and the landing pad, a cylindrical memory stack in the second dielectric layer, and a source line in the first dielectric layer. The first dielectric layer covers the memory region and the transistor. The landing pad is situated in a first horizontal plane and is coupled to a drain region of the transistor. The cylindrical memory stack has a bottom electrode connected to the landing pad and a top electrode electrically connected to a bit line. The source line is situated in a second horizontal plane and is connected to a source region of the transistor. The second horizontal plane is lower than the first horizontal plane.

20 Claims, 4 Drawing Sheets

MAGNETIC MEMORY CELL AND FABRICATION METHOD THEREOF

BACKGROUND OF THE INVENTION

1. Field of the Invention

The present invention relates to the field of semiconductor devices, and more particularly to a spin-transfer torque magnetoresistive random access memory (STT-MRAM) structure and a method of fabricating the same.

2. Description of the Prior Art

As known in the art, spin-transfer torque magnetoresistive random access memory (STT-MRAM) is a non-volatile memory that has come under much scrutiny recently in the industry, which has several advantages over the conventional magnetoresistive random access memory. For example, these advantages include higher endurance, lower-power consumption, and faster operating speed.

In a magneto-tunnel junction (MTJ) including two ferromagnetic layers having a thin insulating layer therebetween, the tunnel resistance varies depending on the relative directions of magnetization of the two ferromagnetic layers. A magnetoresistive random access memory may be a semiconductor device where magnetic elements (MTJ elements) having MTJs utilizing a tunnel magneto resistance (TMR) effect are arranged in a matrix form as a memory cell.

In conventional designs, the source lines (SL) of the MTJ bit cell arrays are arranged to be parallel to the bit line (BL). However, in conventional designs there is no direct and parallel overlap between the source line (SL) and bit line (BL) due to via and metal spacing rules. Therefore, the minimum bit cell size of conventional designs cannot be reduced or minimized as a result of metal and via spacing rules.

Because the memory includes hundreds of thousands of cells, even small area savings in each cell can result in major advantages in density of the memory. Accordingly it is highly desirable to provide apparatus and a method of improving the density of MRAM cells in a memory array by reducing the area of individual MRAM cells.

SUMMARY OF THE INVENTION

The present disclosure provides an improved spin-transfer torque magnetoresistive random access memory (STT-MRAM) structure and a method of fabricating the same that solve the above-mentioned deficiencies of the prior art.

One aspect of the disclosure discloses a magnetic memory cell comprising a substrate having a memory region. A select transistor is disposed in the memory region on the substrate. A first dielectric layer is disposed on the substrate, wherein the first dielectric layer covers the memory region and the select transistor. A landing pad is disposed in the first dielectric layer, wherein the landing pad is located in a first horizontal plane and electrically connected to a drain region of the select transistor. A second dielectric layer is formed to cover the first dielectric layer and the landing pad. A cylindrical memory stack is disposed in the second dielectric layer, wherein the cylindrical memory stack includes a bottom electrode electrically coupled to the landing pad, a top electrode electrically coupled to the bit line on the second dielectric layer, and a magneto-tunnel junction between the bottom electrode and the top electrode. A source line is disposed in the first dielectric layer, wherein the source line is located in a second horizontal plane and is electrically connected to a source region of the select transistor. The second horizontal plane is low than the first horizontal plane.

According to an embodiment of the invention, the landing pad is located in M1 layer. According to an embodiment of the invention, the source line may be located in M0 layer and adjacent to the landing pad, but is not limited thereto. According to an embodiment of the invention, the M0 layer is a tungsten layer, and the M1 layer is a damascened copper layer.

According to an embodiment of the invention, the second dielectric layer may comprise a nitrogen-doped silicon carbide (NDC) layer, a silicon oxide layer, and an ultra-low dielectric constant (ULK) material layer. The magnetic memory cell further includes a via plug disposed in the silicon oxide layer and the NDC layer. The via plug electrically connects the bottom electrode with the landing pad. For example, the via plug may be a tungsten via plug.

According to an embodiment of the invention, a word line is further disposed on the substrate and electrically connected to a gate of the select transistor, wherein the word line extends along a first direction. The source line extends along the first direction, and the bit line extends along a second direction, and the second direction is perpendicular to the first direction.

In another aspect, the magnetic memory cell disclosed in the present disclosure comprises a substrate having a memory region. A select transistor is disposed in the memory region on the substrate. A first dielectric layer is disposed on the substrate, wherein the first dielectric layer covers the memory region and the select transistor. A landing pad is disposed in the first dielectric layer, wherein the landing pad is located in a first horizontal plane and electrically connected to a drain region of the select transistor. The second dielectric layer covers the first dielectric layer and the landing pad. A cylindrical memory stack is disposed in the second dielectric layer, wherein the cylindrical memory stack includes a bottom electrode electrically coupled to the landing pad, a top electrode electrically coupled to the bit line on the second dielectric layer, and a magneto-tunnel junction between the bottom electrode and the top electrode. A source line of the magnetic memory cell is disposed in the second dielectric layer, wherein the source line is located in a second horizontal plane and is electrically connected to a source region of the select transistor. The second horizontal plane is higher than the first horizontal plane. According to an embodiment of the invention, the landing pad is located in the M1 layer. According to an embodiment of the invention, the source line may be located in the M2 layer, but is not limited thereto.

According to an embodiment of the invention, the second dielectric layer may comprise a nitrogen-doped silicon carbide (NDC) layer, a silicon oxide layer, and an ultra-low dielectric constant (ULK) material layer. The magnetic memory cell further includes a via plug disposed in the silicon oxide layer and the NDC layer. The via plug electrically connects the bottom electrode with the landing pad. For example, the via plug may be a tungsten via plug.

Another aspect of the present disclosure discloses a method of forming a magnetic memory cell. A substrate having a memory region is provided. A selective transistor is formed in the memory region on the substrate. A first dielectric layer is formed on the substrate. The first dielectric layer covers the memory region and the select transistor. A landing pad is formed in the first dielectric layer. The landing pad is located in a first horizontal plane and electrically connected to a drain region of the select transistor. A second dielectric layer is formed to cover the first dielectric layer and the landing pad. A cylindrical memory stack is formed in the second dielectric layer. The cylindrical memory stack includes a bottom electrode electrically coupled to the landing pad, and a top electrode electrical coupled to the bit line on the second dielectric layer. A source line is formed. The source line is disposed in a second horizontal plane and is electrically connected to a source region of the select transistor.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized and structural, logical, and electrical changes may be made without departing from the scope of the present invention. Therefore, the following detailed description is not to be considered as limiting, but the embodiments included herein are defined by the scope of the accompanying claims.

Figure 1:
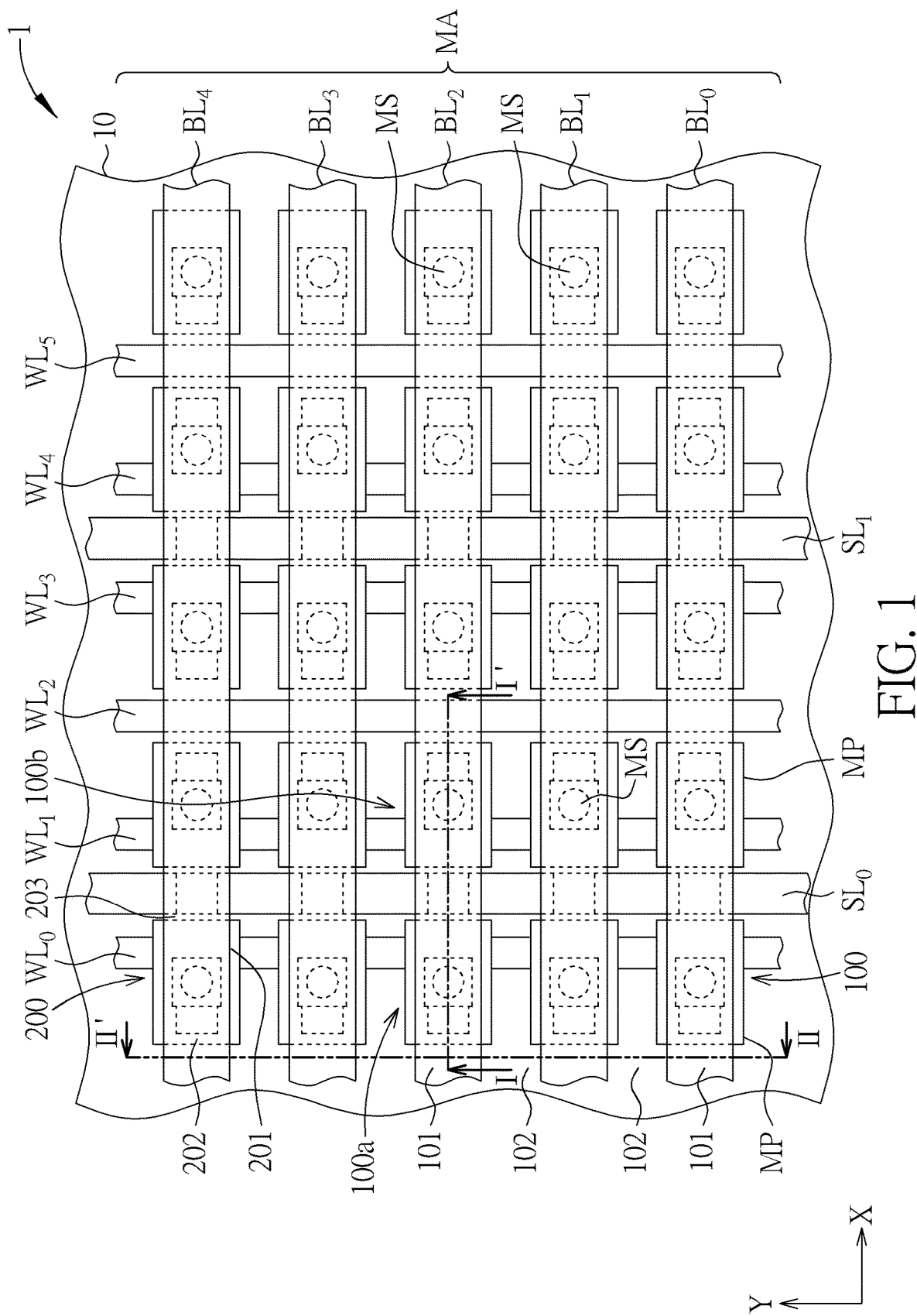
FIG. 1 is a schematic diagram showing a partial layout of a magnetic memory device according to an embodiment of the invention.
Figure 2:
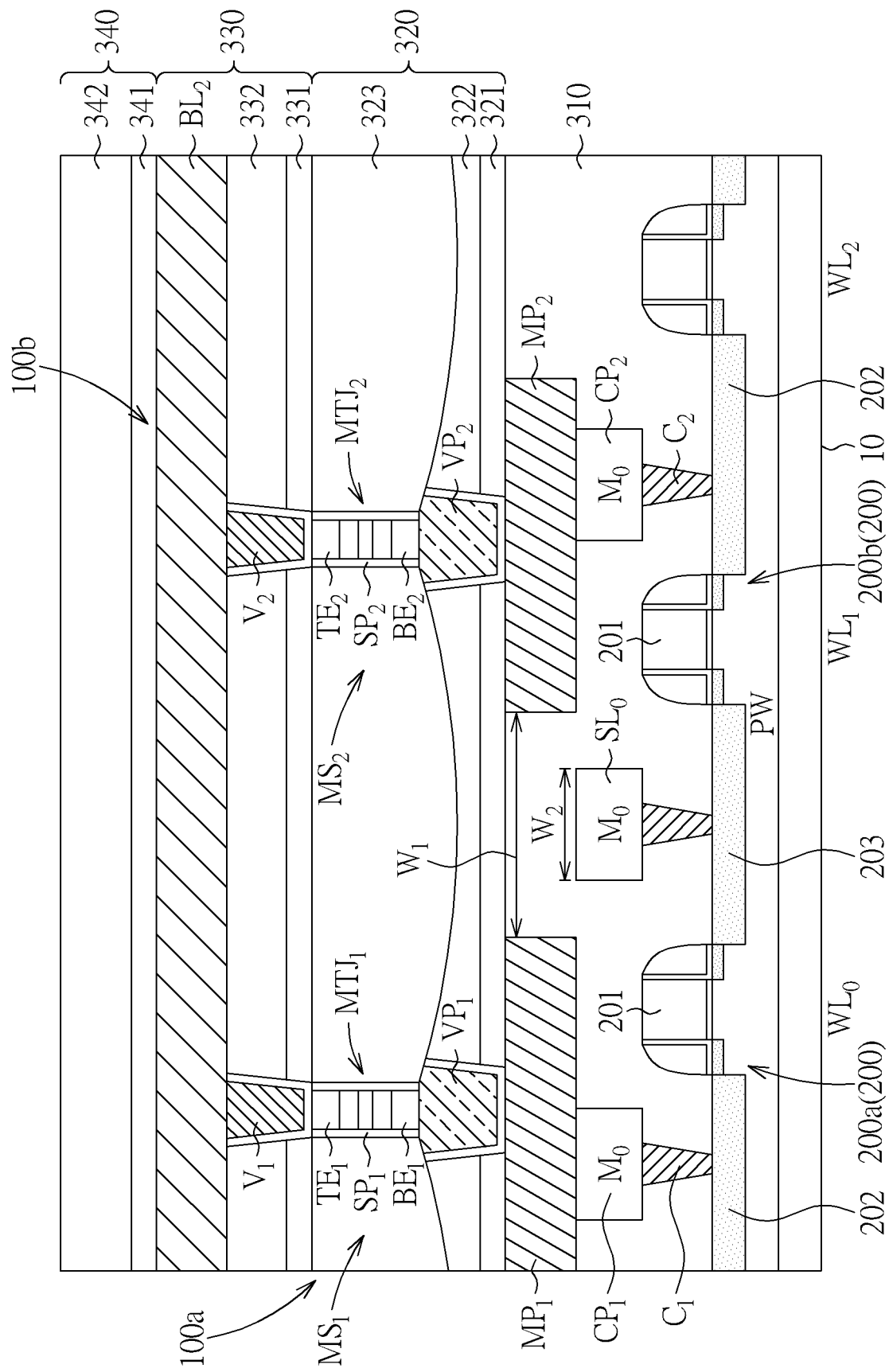
FIG. 2 is a schematic cross-sectional view taken along line I-I' of FIG. 1.
Figure 3:
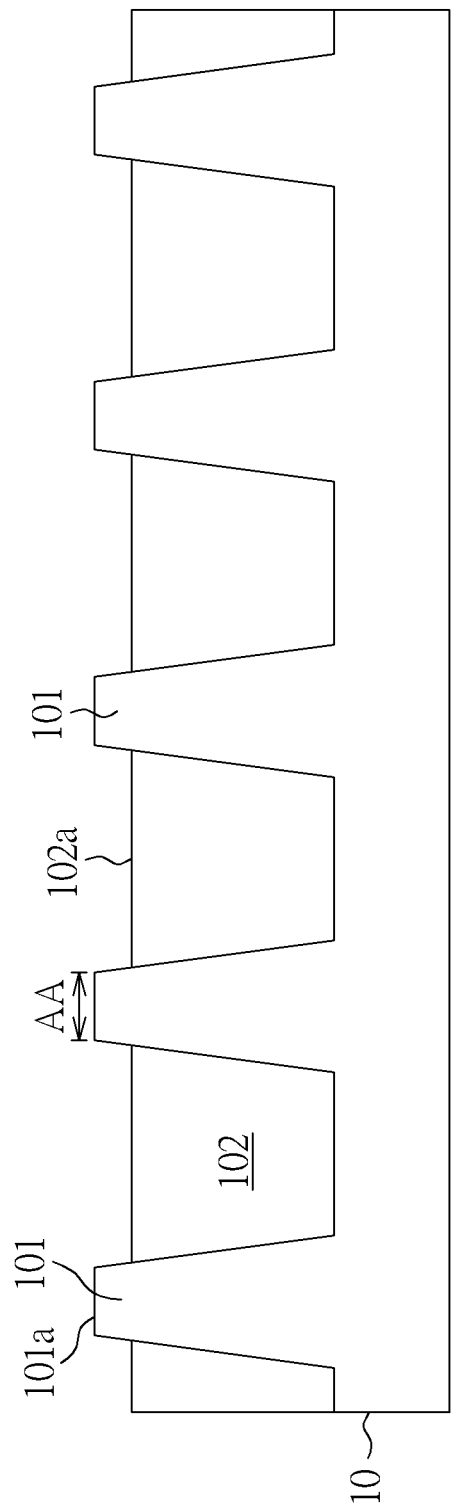
FIG. 3 is a schematic cross-sectional view taken along line II-II' of FIG. 1.

Please refer to FIG. 1 to FIG. 3. FIG. 1 is a schematic diagram showing a partial layout of a magnetic memory device according to an embodiment of the invention. FIG. 2 is a schematic cross-sectional view taken along line I-I' of FIG. 1. FIG. 3 is a schematic cross-sectional view taken along line II-II' of FIG. 1. According to an embodiment of the present invention, as shown in FIG. 1 and FIG. 2, the magnetic memory device 1 comprises a substrate 10, for example, a P-type silicon substrate, but is not limited thereto. According to an embodiment of the present invention, a P-type well (PW) may be disposed in the substrate 10, but is not limited thereto. The substrate 10 comprises a memory region MA. In the memory region MA on the substrate 10, memory cells 100 arranged in an array are provided. On the substrate 10, strip-shaped and mutually parallel active areas 101 are separated from each other by strip-shaped shallow trench isolation (STI) regions 102. In accordance with an embodiment of the invention, the strip-shaped active area 101 and the strip-shaped STI region 102 extend along a reference X-axis.

As shown in FIG. 3, according to an embodiment of the present invention, the upper end of the active area 101 may protrude from the upper surface 102a of the STI region 102 by further recess etching the STI region 102. According to an embodiment of the present invention, for example, the width AA of the upper surface 101a of the active area 101 is approximately 70 nm, and the height of the active area 101 above the STI region 102 is approximately 35 nm, but is not limited thereto.

According to an embodiment of the invention, exemplary word lines $WL_0$~$WL_5$ extending along a reference Y-axis are further provided on the substrate 10. According to an embodiment of the invention, the word lines $WL_0$~$WL_5$ may be polysilicon word lines, but are not limited thereto. According to an embodiment of the present invention, as shown in FIG. 1, the magnetic memory device 1 further comprises select transistors 200 located at intersections of the word lines $WL_0$, $WL_1$, $WL_3$, and $WL_4$ and the active areas 101, respectively. According to an embodiment of the invention, each of the select transistors 200 may comprise a gate 201, a drain doping region (or drain region) 202, and a source doping region (or source region) 203. The portions where the word lines $WL_0$, $WL_1$, $WL_3$, and $WL_4$ overlap with the active areas 101 are the gates 201 of the respective select transistors 200. According to an embodiment of the invention, the exemplary word lines $WL_2$, $WL_5$ can be used to isolate signal interference. According to another embodiment of the invention, the exemplary word lines $WL_2$, $WL_5$ can be omitted, and STI region 102 can be used to isolate signal interference. According to an embodiment of the invention, the drain doping region 202 and the source doping region 203 are respectively formed in the active area 101 on both sides of the gate 201. For example, the drain doping region 202 and the source doping region 203 may be either N-type doped regions or P-type doped regions.

In FIG. 2, only the exemplary word lines $WL_0$, $WL_1$, $WL_2$, and two left and right symmetrical memory cells 100a, 100b are illustrated, wherein the memory cell 100a includes a select transistor 200a, and the memory cell 100b includes a select transistor 200b. The gate 201 of the select transistor 200a is part of the word line $WL_0$, and the gate 201 of the select transistor 200b is part of the word line $WL_1$. The drain doping region 202 and the source doping region 203 of the memory cell 100a and the memory cell 100b may be formed in a P-type well (PW) of the substrate 10. For example, the drain doping region 202 and the source doping region 203 may be N-type doped regions.

As shown in FIG. 2, multiple dielectric layers 310~340 may be disposed on the substrate 10, but are not limited thereto. For example, the dielectric layer 310 can be an ultra-low dielectric constant (ULK) material layer. For example, the ULK material layer may be a carbon-containing silicon oxide (SiOC) layer having a dielectric constant ranging, for example, from 1 to 2.5, but is not limited thereto. According to an embodiment of the present invention, the dielectric layer 310 may be composed of a single layer of insulating material or a plurality of insulating films. The dielectric layer 310 covers the memory region MA and the select transistor 200. According to an embodiment of the present invention, the dielectric layer 320 covers the dielectric layer 310. For example, the dielectric layer 320 may include a nitrogen-doped silicon carbide (NDC) layer 321, a silicon oxide layer 322 on the NDC layer 321, and a ULK material layer 323 on the silicon oxide layer 322. For example, the silicon oxide layer 322 may be a TEOS silicon oxide layer. The TEOS silicon oxide layer refers to a silicon oxide layer deposited by using tetraethoxysilane (TEOS) as a reaction gas.

According to an embodiment of the present invention, a dielectric layer 330 and a dielectric layer 340 may be formed on the dielectric layer 320. The dielectric layer 330 may comprise, for example, a nitrogen-doped silicon carbide (NDC) layer 331 and an ULK material layer 332. The dielectric layer 340 may comprise, for example, a nitrogen-doped silicon carbide (NDC) layer 341 and a ULK material layer 342.

As shown in FIG. 1, landing pads MP are disposed in the memory region MA. The landing pads MP are arranged in an array. Each landing pad MP overlaps with the drain doping region 202 of the select transistor 200. Further, each of the landing pads MP may partially overlap with the underlying word lines $WL_0$, $WL_1$, $WL_3$, and $WL_4$ in the X-axis direction. Further, each of the landing pads MP may further partially overlap with the source doping region 203 of the select transistor 200 in the X-axis direction. In FIG. 2, only two exemplary landing pads $MP_1$ and $MP_2$ of the memory cells 100a and 100b are illustrated for the sake of simplicity. According to an embodiment of the invention, the landing pads $MP_1$ and $MP_2$ are disposed in the dielectric layer 310.

According to an embodiment of the invention, as shown in FIG. 2, the landing pads $MP_1$ and $MP_2$ are located in a first horizontal plane and are electrically coupled to the drain doped regions 202 of select transistors 200a and 200b, respectively. According to an embodiment of the invention, the landing pads $MP_1$ and $MP_2$ are located in a first metal (M1) layer. According to an embodiment of the invention, the M1 layer is a damascened copper layer. The landing pads $MP_1$ and $MP_2$ are very close to each other. For example, the distance $w_1$ between the landing pad $MP_1$ and the landing pad $MP_2$ may be about 60 nm, but is not limited thereto. The landing pad $MP_1$ and landing pad $MP_2$ can be electrically coupled to the drain doped regions 202 of the select transistors 200a and 200b via contact plugs $C_1$ and $C_2$, respectively. For example, the contact plugs $C_1$ and $C_2$ may be tungsten plugs. According to an embodiment of the present invention, contact pads $CP_1$ and $CP_2$ may be provided between the landing pad $MP_1$ and the contact plugs $C_1$ and between the landing pad $MP_2$ and $C_2$, respectively. The contact pads $CP_1$ and $CP_2$ may be tungsten contact pads, and may be formed in the zero metal (M0) layer.

As shown in FIG. 1, cylindrical memory stacks MS are disposed in the memory region MA. The cylindrical memory stacks MS are arranged in matrix or array, and the cylindrical memory stacks MS are aligned with the landing pads MP. FIG. 2 illustrates via plugs $VP_1$ and $VP_2$ disposed in the silicon oxide layer 322 and the NDC layer 321 in accordance with an embodiment of the present invention. FIG. 2 further illustrates two exemplary cylindrical memory stacks $MS_1$ and $MS_2$ disposed in the second dielectric layer 320 in accordance with an embodiment of the present invention. According to an embodiment of the present invention, the cylindrical memory stacks $MS_1$ and $MS_2$ may comprise bottom electrodes $BE_1$ and $BE_2$ electrically coupled to landing pads $MP_1$ and $MP_2$ through via plugs $VP_1$ and $VP_2$, respectively, and top electrodes $TE_1$ and $TE_2$ electrically coupled to the bit line $BL_2$ disposed in the third dielectric layer 330 through vias $V_1$ and $V_2$, respectively.

According to an embodiment of the present invention, as shown in FIG. 2, the via plug $VP_1$ is electrically connected to the bottom electrode $BE_1$ and the landing pad $MP_1$, and the via plug $VP_2$ is electrically connected to the bottom electrode $BE_2$ and the landing pad $MP_2$. According to an embodiment of the present invention, the via plugs $VP_1$ and $VP_2$ may be tungsten via plugs, but are not limited thereto. According to an embodiment of the invention, the bit line $BL_2$ and the vias $V_1$ and $V_2$ may be dual-damascened copper metal structures formed in the third dielectric layer 330.

As shown in FIG. 2, the cylindrical memory stack $MS_1$ further comprises a magneto-tunnel junction element $MTJ_1$ interposed between the bottom electrode $BE_1$ and the top electrode $TE_1$, and the cylindrical memory stack $MS_2$ further comprises a magneto-tunnel junction element $MTJ_2$ between the bottom electrode $BE_2$ and the top electrode $TE_2$. According to an embodiment of the present invention, a sidewall spacer $SP_1$ may be disposed on a sidewall of the cylindrical memory stack $MS_1$, and a sidewall spacer $SP_2$ may be disposed on a sidewall of the cylindrical memory stack $MS_2$. According to an embodiment of the present invention, for example, the sidewall spacer $SP_1$ and the sidewall spacer $SP_2$ may be a silicon nitride sidewall spacer, but are not limited thereto.

According to an embodiment of the present invention, the bottom electrodes $BE_1$ and $BE_2$ may include, for example but not limited to, tantalum (Ta), platinum (Pt), copper (Cu), gold (Au), aluminum (Al), or the like. The multi-layer structure of the magneto-tunnel junction elements $MTJ_1$ and $MTJ_2$ is well-known in the art, so the details thereof will not be described herein. For example, the magneto-tunnel junction elements $MTJ_1$ and $MTJ_2$ may include a fixed layer, a free layer, and a capping layer, but are not limited thereto. The fixed layer may be composed of an antiferromagnetic (AFM) material, for example, iron manganese (FeMn), platinum manganese (PtMn), lanthanum manganese (IrMn), nickel oxide (NiO), etc., for fixing or limiting the direction of the magnetic moment of the adjacent layer. The free layer may be composed of a ferromagnetic material such as iron, cobalt, nickel or an alloy thereof such as cobalt-iron-boron (CoFeB), but is not limited thereto. According to an embodiment of the present invention, for example, the top electrodes $TE_1$ and $TE_2$ may include a ruthenium (Ru) layer and a tantalum (Ta) layer, but are not limited thereto.

FIG. 1 also illustrates exemplary bit lines $BL_0 \sim BL_4$ extending along the reference X-axis. According to an embodiment of the present invention, as shown in FIG. 1, the bit lines $BL_0 \sim BL_4$ approximately overlap and align with the underlying strip-shaped active areas 101. According to an embodiment of the present invention, the bit lines $BL_0 \sim BL_4$ may be formed in the upper metal interconnect, for example, in the second metal (M2) layer or in the third metal (M3) layer.

As shown in FIGS. 1 and 2, source lines SL extending along the reference Y-axis direction are further provided on the substrate 10 (FIG. 1 illustrates only $SL_0$ and $SL_1$, and FIG. 2 illustrates only $SL_0$). For example, the extension direction of the source lines SL is parallel to the word line WL and perpendicular to the bit line BL. As shown in FIG. 1, the source line $SL_0$ is disposed between the word lines $WL_0$ and $WL_1$, and the source line $SL_1$ is disposed between the word lines $WL_3$ and $WL_4$. As shown in FIG. 2, the illustrated source line $SL_0$ is disposed in the first dielectric layer 310.

According to an embodiment of the invention, the illustrated source line $SL_0$ is located in a second horizontal plane and is electrically coupled to the common source region 203 of the select transistors 200a and 200b. According to an embodiment of the invention, the second horizontal plane is lower than the first horizontal plane. In other words, the source line $SL_0$ illustrated in FIG. 2 is lower than the landing pads $MP_1$ and $MP_2$. According to an embodiment of the present invention, the source line $SL_0$ illustrated in FIG. 2 is located in the M0 layer and is in close proximity to the landing pads $MP_1$ and $MP_2$. For example, the line width $w_2$ of the source line $SL_0$ illustrated in FIG. 2 is about 40 nm, so that the gap width between the source line $SL_0$ and the adjacent pads $MP_1$ and $MP_2$ is about 10 nm. According to an embodiment of the invention, the M0 layer is a tungsten layer.

The main advantage of the present invention is that the size of the MRAM memory cell can be further reduced to about 0.022 µm² through the design of the magnetic memory device 1 described above, mainly because the source line SL is disposed in the M0 layer. The pitch size of the active area 101 in the reference Y-axis direction can be reduced from 240 nm to 140 nm. Further, by protruding the active area 101 shown in FIG. 3 above the STI region 102, the problem of insufficient turn-on current ($I_{ON}$) due to the reduction in the pitch size of the active area 101 in the reference Y-axis direction may be solved.

Figure 4:
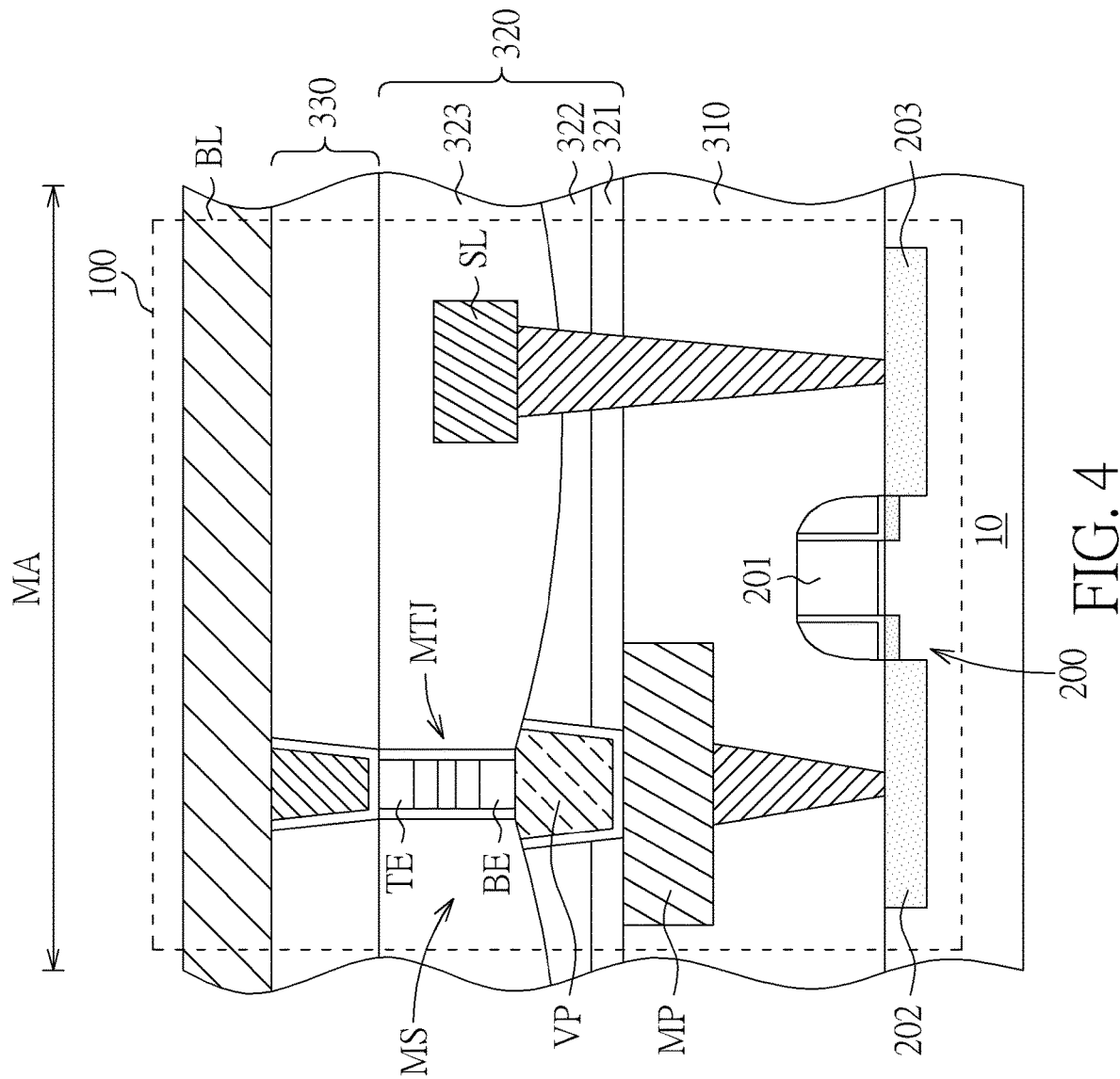
FIG. 4 is a schematic cross-sectional view showing a magnetic memory cell structure according to another embodiment of the present invention.

FIG. 4 is a schematic cross-sectional view showing a magnetic memory cell structure according to another embodiment of the present invention, wherein like elements, materials or layers are designated by like reference numerals. As shown in FIG. 4, the magnetic memory cell 100 comprises a substrate 10 having a memory region MA. A select transistor 200 is provided in the memory region MA on the substrate 10. A first dielectric layer 310 is disposed on the substrate 10, wherein the first dielectric layer 310 covers the memory region MA and the select transistor 200. A landing pad MP is disposed in the first dielectric layer 310, wherein the landing pad MP is located at a first horizontal plane and electrically connected to the drain doped region (or drain region) 202 of the select transistor 200. The second dielectric layer 320 covers the first dielectric layer 310 and the landing pad MP.

A cylindrical memory stack MS is disposed in the second dielectric layer 320, wherein the cylindrical memory stack MS comprises a bottom electrode BE electrically coupled to the landing pad MP, a top electrode TE electrically coupled to the bit line BL on the second dielectric layer 320, and magneto-tunnel junction element MTJ between the bottom electrode BE and the top electrode TE.

The difference between the magnetic memory cell 100 in FIG. 4 and the structure shown in FIG. 1 to FIG. 3 is that the source line SL of the magnetic memory cell 100 in FIG. 4 is disposed in the second dielectric layer 320. The source line SL is located at a second horizontal plane and is electrically connected to a source doped region (or source region) 203 of the select transistor 200. The second horizontal plane is higher than the first horizontal plane. According to an embodiment of the invention, the landing pad MP is located in the first metal (M1) layer. According to an embodiment of the present invention, the source line SL may be located in the second metal (M2) layer, but is not limited thereto.

Similarly, as shown in FIG. 4, the second dielectric layer 320 may include a nitrogen-doped silicon carbide (NDC) layer 321, a silicon oxide layer 322, and an ultra-low dielectric constant (ULK) material layer 323. The magnetic memory cell 100 includes a via plug VP disposed in the silicon oxide layer 322 and the NDC layer 321. The via plug VP is electrically connects the bottom electrode BE with the landing pad MP. For example, the via plug VP may be a tungsten via plug.

Another aspect of the present disclosure discloses a method of forming a magnetic memory cell, comprising: providing a substrate 10 having a memory region MA. A select transistor 200 is formed in the memory region MA on the substrate 10. A first dielectric layer 310 is formed on the substrate 10, wherein the first dielectric layer 310 covers the memory region MA and the select transistor 200. A landing pad MP is formed in the first dielectric layer 310, wherein the landing pad MP is located at a first horizontal plane and electrically connected to a drain region 202 of the select transistor 200. A second dielectric layer 320 is formed to cover the first dielectric layer 310 and the landing pad MP. A cylindrical memory stack MS is formed in the second dielectric layer 320, wherein the cylindrical memory stack MS includes a bottom electrode BE electrically coupled to the landing pad MP and a top electrode TE electrical coupled to bit line BL on the second dielectric layer 320. A source line SL is formed, wherein the source line SL is located at a second horizontal plane and is electrically connected to a source region 203 of the select transistor 200.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A magnetic memory cell, comprising:
a substrate having a memory region;
a select transistor on the substrate within the memory region;
a first dielectric layer disposed on the substrate, wherein the first dielectric layer covers the memory region and the select transistor;
a landing pad in the first dielectric layer, wherein the landing pad is situated in a first horizontal plane and is electrically coupled to a drain region of the select transistor;
a second dielectric layer covering the first dielectric layer and the landing pad;
a cylindrical memory stack in the second dielectric layer, wherein the cylindrical memory stack comprises a bottom electrode electrically coupled to the landing pad and a top electrode electrically coupled to a bit line disposed above the second dielectric layer; and
a source line in the first dielectric layer, wherein the source line is situated in a second horizontal plane and is electrically coupled to a source region of the select transistor, wherein the second horizontal plane is lower than the first horizontal plane.

2. The magnetic memory cell of claim 1, wherein the second dielectric layer comprises a nitrogen-doped silicon carbide (NDC) layer, a silicon oxide layer on the NDC layer, and an ultra-low k material layer on the silicon oxide layer.

3. The magnetic memory cell of claim 2 further comprising a via plug disposed in the silicon oxide layer and the NDC layer.

4. The magnetic memory cell of claim 3, wherein the via plug electrically connects the bottom electrode to the landing pad.

5. The magnetic memory cell of claim 3, wherein the via plug is a tungsten via plug.

6. The magnetic memory cell of claim 1, wherein the landing pad is in a first metal (M1) layer.

7. The magnetic memory cell of claim 6, wherein the source line is in a zero metal (M0) layer and is in close proximity to the landing pad.

8. The magnetic memory cell of claim 7, wherein the zero metal (M0) layer is a tungsten layer and the first metal (M1) layer is a damascened copper layer.

9. The magnetic memory cell of claim 1 further comprising a word line disposed on the substrate and electrically coupled to a gate of the select transistor, wherein the word line extends along a first direction.

10. The magnetic memory cell of claim 9, wherein the source line extends along the first direction and the bit line extends along a second direction that is orthogonal to the first direction.

11. A magnetic memory cell, comprising:
a substrate having a memory region;
a select transistor on the substrate within the memory region;
a first dielectric layer disposed on the substrate, wherein the first dielectric layer covers the memory region and the select transistor;
a landing pad in the first dielectric layer, wherein the landing pad is situated in a first horizontal plane and is electrically coupled to a drain region of the select transistor;
a second dielectric layer covering the first dielectric layer and the landing pad;
a cylindrical memory stack in the second dielectric layer, wherein the cylindrical memory stack comprises a bottom electrode electrically coupled to the landing pad and a top electrode electrically coupled to a bit line disposed above the second dielectric layer; and
a source line in the second dielectric layer, wherein the source line is situated in a second horizontal plane and is electrically coupled to a source region of the select transistor, wherein the second horizontal plane is higher than the first horizontal plane.

12. The magnetic memory cell of claim 11, wherein the second dielectric layer comprises a nitrogen-doped silicon carbide (NDC) layer, a silicon oxide layer on the NDC layer, and an ultra-low k material layer on the silicon oxide layer.

13. The magnetic memory cell of claim 12 further comprising a via plug disposed in the silicon oxide layer and the NDC layer.

14. The magnetic memory cell of claim 13, wherein the via plug electrically connects the bottom electrode to the landing pad.

15. The magnetic memory cell of claim 13, wherein the via plug is a tungsten via plug.

16. The magnetic memory cell of claim 11, wherein the landing pad is in a first metal (M1) layer.

17. The magnetic memory cell of claim 16, wherein the source line is in a second metal (M2) layer.

18. The magnetic memory cell of claim 17, wherein the first metal (M1) layer and the second metal (M2) layer are damascened copper layers.

19. The magnetic memory cell of claim 11 further comprising a word line disposed on the substrate and electrically coupled to a gate of the select transistor, wherein the word line extends along a first direction.

20. The magnetic memory cell of claim 19, wherein the source line extends along the first direction and the bit line extends along a second direction that is orthogonal to the first direction.

* * * * *